United States Patent
Kohyama et al.

[11] Patent Number: 6,015,731
[45] Date of Patent: Jan. 18, 2000

[54] METHOD OF MANUFACTURING A SEMICONDUCTOR MEMORY DEVICE

[75] Inventors: Yusuke Kohyama, Yokosuka; Akira Sudo, Yokohama, both of Japan

[73] Assignee: Kabushiki Kaisha Toshiba, Kawasakishi, Japan

[21] Appl. No.: 08/923,735

[22] Filed: Sep. 4, 1997

Related U.S. Application Data

[60] Continuation of application No. 08/606,407, Feb. 23, 1996, abandoned, which is a division of application No. 08/334,396, Nov. 3, 1994, Pat. No. 5,521,407.

[30] Foreign Application Priority Data

Nov. 8, 1993 [JP] Japan ................................. 5-278149

[51] Int. Cl.⁷ ............................................. H01L 21/8242
[52] U.S. Cl. ........................................ 438/243; 438/248
[58] Field of Search ............................. 437/52, 60, 919, 437/203, 48, 61–62; 438/243–249, 386–392

[56] References Cited

U.S. PATENT DOCUMENTS

| | | | |
|---|---|---|---|
| 4,384,399 | 5/1983 | Kuo ............................................ | 437/48 |
| 4,422,092 | 12/1983 | Guterman ................................... | 357/41 |
| 4,855,953 | 8/1989 | Tsukamoto et al. ...................... | 365/149 |
| 4,894,697 | 1/1990 | Chin et al. ............................... | 357/23.6 |
| 4,918,502 | 4/1990 | Kaga et al. ............................... | 357/23.6 |
| 5,045,489 | 9/1991 | Gill et al. .................................. | 437/43 |
| 5,237,528 | 8/1993 | Sunami et al. ........................... | 365/149 |
| 5,258,321 | 11/1993 | Shimizu et al. .......................... | 437/52 |
| 5,374,580 | 12/1994 | Baglee et al. ............................. | 437/52 |
| 5,470,777 | 11/1995 | Nagata et al. ............................ | 437/52 |

FOREIGN PATENT DOCUMENTS

| | | |
|---|---|---|
| 0 340 474 | 11/1989 | European Pat. Off. . |
| 0 412 558 A2 | 2/1991 | European Pat. Off. . |

OTHER PUBLICATIONS

Toru Kaga et al., IEEE Transactions on Electron Devices, dated Aug. 8, 1988, vol. 35, No. 8, "Half–$V_{cc}$ Sheath–Plate Capacitor DRAM Cell with Self–Aligned Buried Plate Wiring" pp. 1257–1263.

*Primary Examiner*—Jey Tsai
*Attorney, Agent, or Firm*—Banner & Witcoff, Ltd.

[57] ABSTRACT

The first element separation oxide film consisting of a plurality of line-shaped portions parallel to the bit line is formed on the surface of the P-type silicon substrate. The first and second trenches are formed in that portion of the P-type silicon substrate which is located between an adjacent pair of line-shaped portions of the first element separation oxide film such that both sides of the trenches come in contact with the first element separation oxide film. A sheath plate capacitor is formed in each of the trenches. The second element separation oxide film having a thickness less than that of the first element separation oxide film is formed on that portion of the surface of the P-type silicon substrate which is located between the first and second trenches.

15 Claims, 5 Drawing Sheets

METHOD OF MANUFACTURING A SEMICONDUCTOR MEMORY DEVICE

This application is a continuation of application Ser. No. 08/606,407, filed Feb. 23, 1996, now abandoned; which is a division of Ser. No. 08/334,396, filed Nov. 3, 1994, now U.S. Pat. No. 5,521,407.

BACKGROUND OF THE INVENTION

1. Field of the Invention

The present invention relates to a semiconductor memory device and a method of manufacturing the device, and particularly, to a pattern layout of a high-integration and large-capacity dynamic RAM (random access read/write memory).

2. Description of the Related Art

The degree of integration and the size of dynamic RAMs have increased as much as in the last three years. In accordance with such a size increase, the structure in which a capacitor is formed within a trench for the purpose of integrating a capacitor having a sufficient capacity within a small area, has been proposed. An example of the device having such a structure is a dynamic RAM having a HSPC (half-Vcc sheath-plate capacitor) discussed in IEEE TRANSACTIONS ON ELECTRON DEVICES, VOL. 35, NO. 8, 1988, P.1257.

Figure 1:
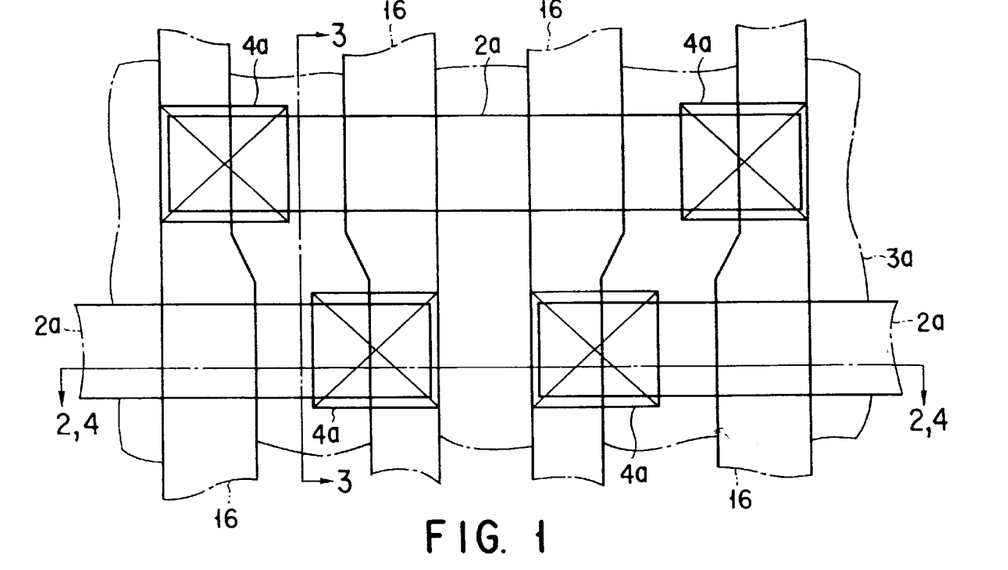
FIG. 1 is a plan view showing the layout of the main layer of a conventional semiconductor memory device.
Figure 2:
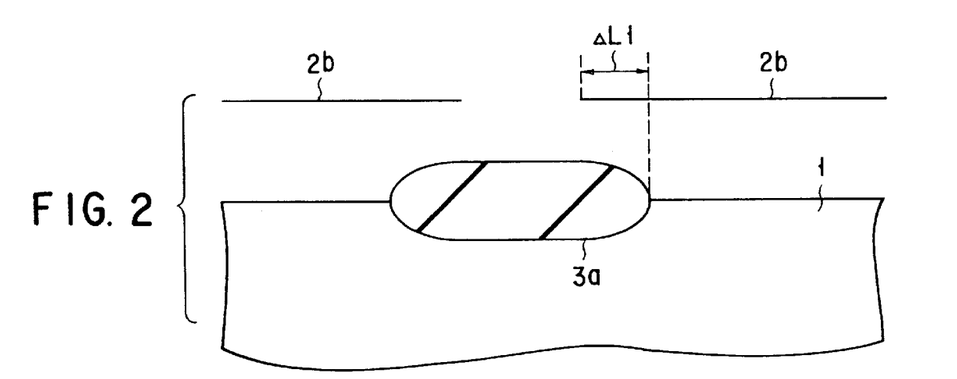
FIG. 2 illustrates a first step of the method of manufacturing the conventional semiconductor memory device, and is a cross section of the conventional semiconductor memory device after the first step, taken along the line 2—2 of FIG. 1.
Figure 3:
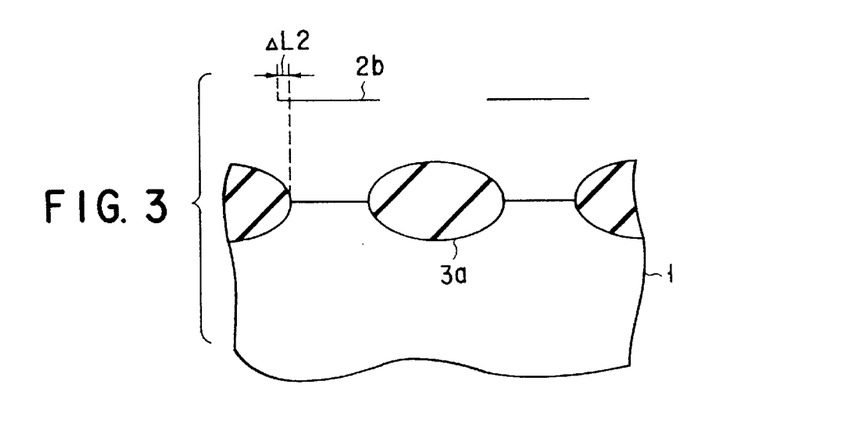
FIG. 3 illustrates a first step of the method of manufacturing the conventional semiconductor memory device, and is a cross section of the conventional semiconductor memory device after the first step, taken along the line 3—3 of FIG. 1.
Figure 4:
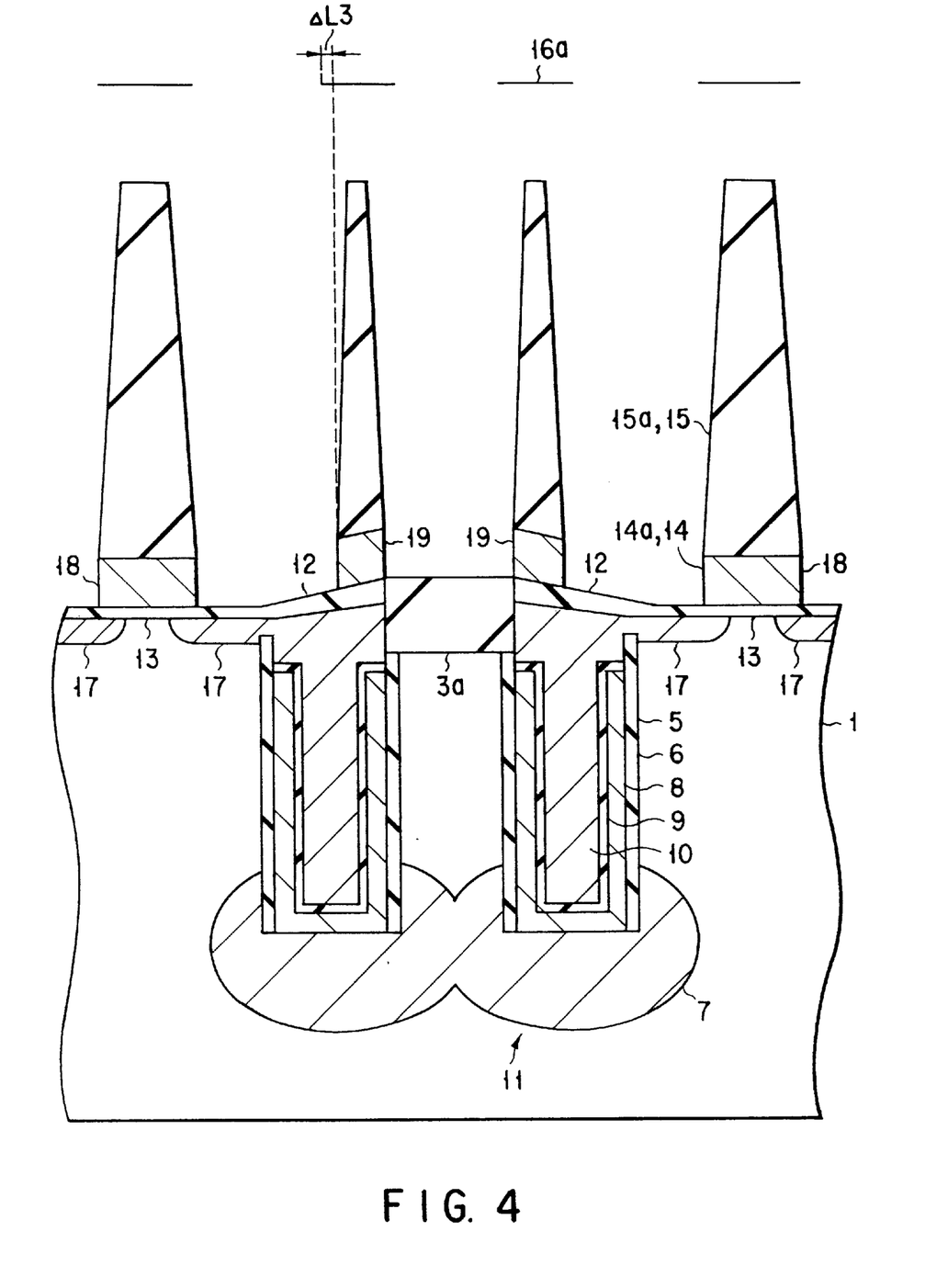
FIG. 4 illustrates a second step of the method of manufacturing the conventional semiconductor memory device, and is a cross section of the conventional semiconductor memory device taken along the line 4—4 of FIG. 1.

FIG. 1 is a plan view showing a layout of the main layer of a conventional semiconductor memory device. FIGS. 2 to 4 illustrate a method of manufacturing the conventional semiconductor memory device. FIG. 2 illustrates the first step, and is a cross section of the section taken along the line 2—2 in FIG. 1, after the completion of the first step. FIG. 3 illustrates the first step, and is a cross section of the section taken along the line 3—3 in FIG. 1, after the completion of the first step. FIG. 4 illustrates the second step, and is a cross section of the section taken along the line 4—4 in FIG. 1, after the completion of the second step.

First, as shown in FIGS. 2 and 3, an element separation oxide film 3a is formed on the surface of a P-type silicon substrate 1 by the LOCOS (local oxidation of silicon) method using a mask 2b having the element separation pattern 2a.

More specifically, a silicon nitride film (not shown) is formed on the surface of a P-type silicon substrate 1, and the silicon nitride film is etched using the mask 2b having the element separation pattern 2a. Next, the surface of the portion of the P-type silicon substrate 1, which is exposed by the etching, is thermally oxidized, thus forming an element separation oxide film 3a. In this case, the transfer error between the mask 2b having the element separation pattern 2a and the element separation oxide film 3a varies in accordance with the pattern shape of the element separation oxide film 3a. In detail, the transfer error $\Delta L_1$ with regard to the element separation oxide film 3a shown in FIG. 2 is larger than the conversion error $\Delta L_2$ with regard to the element separation oxide film 3a shown in FIG. 3.

After that, the silicon nitride film is removed, and a sheath plate capacitor (HSPC) 11 is formed on a P-type silicon substrate 1 as shown in FIG. 4 by the method described in IEEE TRANSACTIONS ON ELECTRON DEVICES.

More specifically, a trench 5 having a depth of about 3 μm is formed on the P-type silicon substrate 1 by use of a mask (not shown) corresponding to a trench pattern 4a shown in FIG. 1. During the formation, the trench 5 goes through a part of the element separation oxide film 3a. Next, a $SiO_2$ film 6 is formed on only a side wall of the trench 5. Then, a diffusion layer plate 7 is formed on a bottom portion of the trench 5, and a plate electrode 8 made by processing polysilicon into a sheath shape, is formed in the trench 5. After that, a capacitor insulation film 9 is formed in and on the plate electrode 8. Subsequently, the trench 5 is filled with polysilicon, and a storage node electrode 10 is formed in the trench 5. Thus, a sheath plate capacitor 11 consisting of the plate electrode 8, capacitor insulation film 9 and storage node electrode 10, is formed.

An oxide film 12 is formed selectively on the storage node electrode 10, and a gate insulation film 13 is formed on the surface of the P-type silicon substrate 1.

A polysilicon film 14a is deposited on the gate insulation film 13, the oxide film 12 and the element separation oxide film 3a. A resist 15a is applied on the polysilicon film 14a. After that, the resist 15a is patterned by a mask 16a corresponding to a word line pattern 16 shown in FIG. 1, a resist pattern 15 is formed on the polysilicon film 14a. The polysilicon film 14a is etched with the resist pattern 15 serving as a mask, thus forming a gate electrode 14 made of the polysilicon film 14a. Next, an ion implantation is carried out using the gate electrode 14 as a mask, and therefore a diffusion layer 17 of the source-drain region is formed on the P-type silicon substrate 1.

The resist pattern 15 is removed, and bit lines and a wiring portion are formed, thus completing a dynamic RAM.

According to the conventional semiconductor memory device and the manufacturing method thereof, the element separation oxide film 3a is formed on the surface of the P-type silicon substrate 1 with the mask 2b having the element separation pattern 2a shown in FIG. 1. In accordance with the shape of the element separation oxide film 3a, the transfer error between the element separation oxide film 3a and the mask 2b varies, as indicated by $\Delta L_1$ and $\Delta L_2$. More specifically, the transfer error $\Delta L_1$ indicated by the cross section of the element separation oxide film 3a taken along the line 2—2 of FIG. 1 differs from the transfer error $\Delta L_2$ indicated by the cross section taken along the line 3—3 of FIG. 1, which is vertical to the line 2—2. As a result, the conventional manufacturing method is not appropriate for the downsizing of devices, and the controllability of the manufacturing step is low, thus significantly degrading the yield of the product.

Further, it is difficult to manufacture a phase shift mask of the element separation pattern 2a shown in FIG. 1, and therefore the conventional method is not suitable for minute elements.

Furthermore, as can be seen in FIG. 4, the continuous surface of all of the element separation oxide film 3a, the oxide film 12 and the gate insulation film 13 cannot be flattened. Therefore, a difference in level is created in the portion of the polysilicon film 14a formed on the element separation film 3a, the oxide film 12 and the gate insulation film 13, which is situated on the boundary between the oxide film 12 and the insulation film 13. Consequently, the transfer error $\Delta L_3$ with respect to the mask 16a occurs only in pass word lines 19, such that the pass word lines 19 are made narrower than the designed value. As a result, the performance of the product device may be degraded, i.e. an increase in the wiring resistance results.

SUMMARY OF THE INVENTION

The purpose of the present invention is to provide a semiconductor memory device having an enhanced performance and suitable for downsizing, as well as a method of manufacturing a semiconductor memory device, having an improved controllability in its manufacture steps, and an improved product yield.

The object of the invention is achieved by the following structure.

The method of manufacturing a semiconductor memory device, comprising the steps of:

forming a first element separation oxide film having a plurality of lines parallel to each other, on a surface of a semiconductor substrate having a memory cell region; and forming a second element separation oxide film having a thickness less than a thickness of the first element separation oxide film, on a portion of the surface of the semiconductor substrate, which is located adjacent to each of lines of the first element separation oxide film.

The semiconductor memory device comprising:

a semiconductor substrate;

a plurality of first element separation oxide films formed on an surface of the semiconductor substrate, the plurality of first element separation oxide films being arranged in lines parallel to each other;

first and second trenches formed on the semiconductor substrate at a position between adjacent ones of the first element separation oxide films; and a second element separation oxide film formed on a portion of the surface of the semiconductor substrate, which is located between the first and second trenches, a thickness of the second element separation oxide film being less than a thickness of the first element separation oxide film.

According to the present invention, a plurality of line-shaped first element separation oxide films parallel to each other, are formed on the surface of the semiconductor substrate having a memory cell region. Since the first element separation oxide films has such an arrangement, the transfer error with regard to the element separation pattern can be made constant. Consequently, the semiconductor memory device can be downsized, and the controllability during the manufacture of the device can be improved. Therefore, the product yield can be improved. Further, the phase shift mask of the element separation pattern for the first element separation oxide films can be easily manufactured, enabling a further downsizing of the device.

First and second trenches are formed in the semiconductor substrate between adjacent ones of the first element separation oxide films. The second element separation oxide film which is thinner than the first element separation oxide films is formed on the surface of the semiconductor substrate and between adjacent lines of the first element separation oxide films. More specifically, the second element separation oxide film thinner than the first element separation oxide films is formed in the element separation regions between the lines of the first element separation oxide film. With this structure, the pass word lines situated on the second element separation regions and the word lines situated on the element regions are leveled with each other. Consequently, the pass word lines are not formed narrower than the designed value, thus improving the performance of the device as compared to the prior art.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate a presently preferred embodiment of the invention, and together with the general description given above and the detailed description of the preferred embodiment given below, serve to explain the principles of the invention.

DETAILED DESCRIPTION OF THE PREFERRED EMBODIMENT

An embodiment of the present invention will now be described with reference to accompanying drawings.

Figure 5:
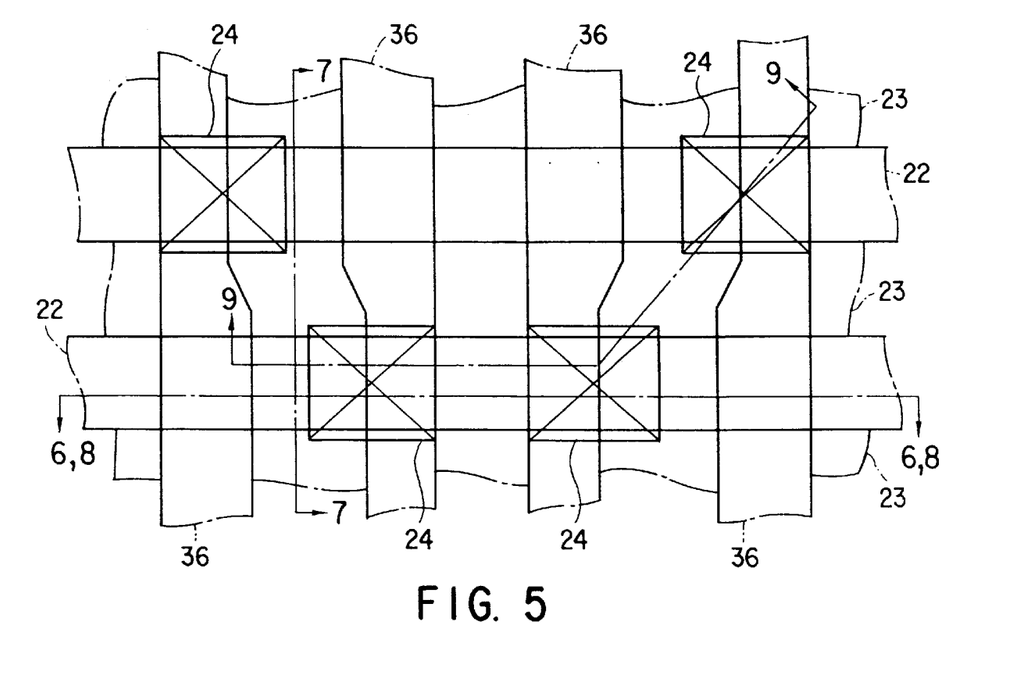
FIG. 5 is a plan view showing the layout of the main layer of a semiconductor memory device according to an embodiment of the present invention.

FIG. 5 is a plan view showing the layout of the main layer of the semiconductor memory device according to the present invention.

Figure 6:
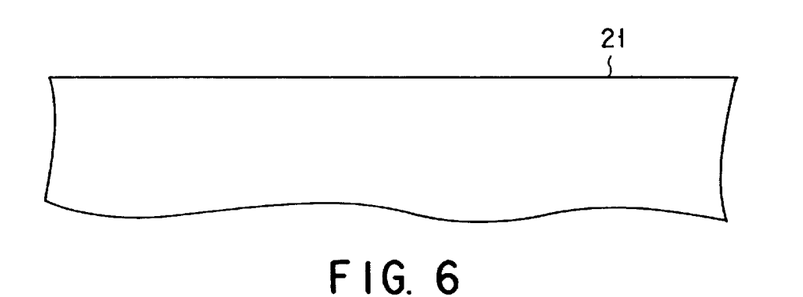
FIG. 6 illustrates a first step of the method of manufacturing the semiconductor memory device, according to an embodiment of the present invention, and is a cross section of the semiconductor memory device after the first step, taken along the line 6—6 of FIG. 5.
Figure 7:
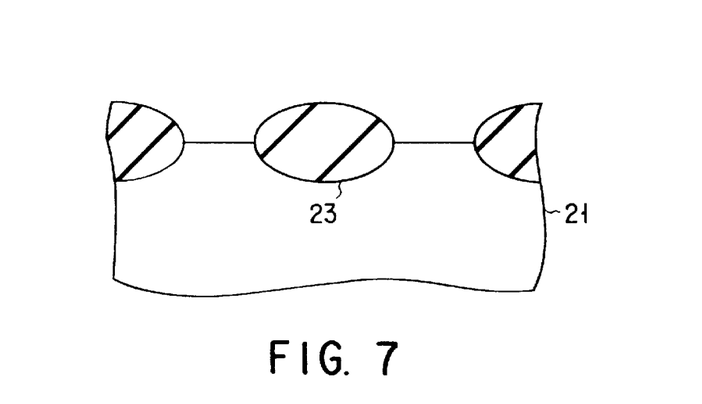
FIG. 7 illustrates the first step of the method of manufacturing the semiconductor memory device, according to an embodiment of the present invention, and is a cross section of the semiconductor memory device after the first step, taken along the line 7—7 of FIG. 5.
Figure 8:
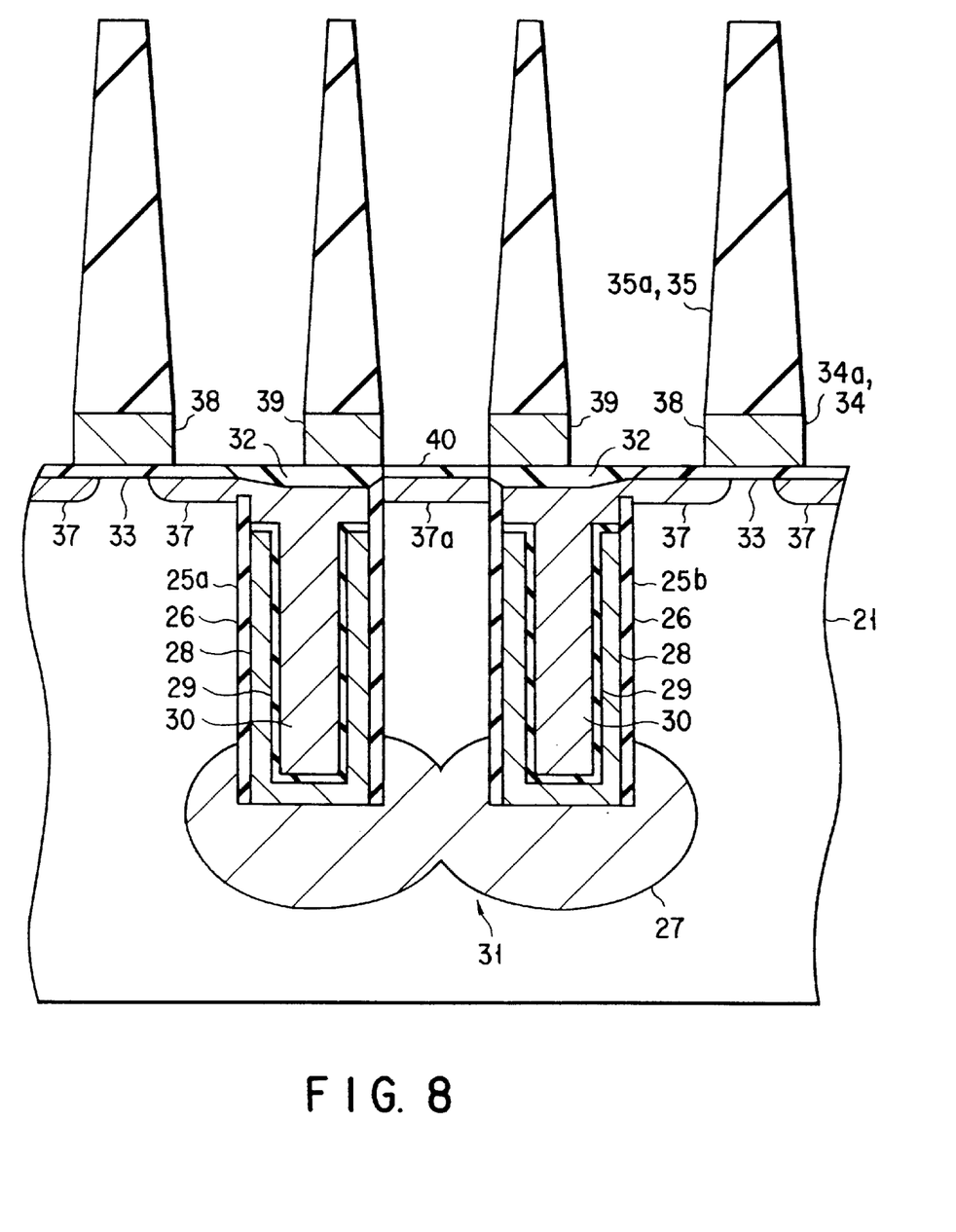
FIG. 8 illustrates a second step of the method of manufacturing the semiconductor memory device, according to an embodiment of the present invention, and is a cross section of the semiconductor memory device after the second step, taken along the line 8—8 of FIG. 5.

FIGS. 6 to 8 illustrate the method of manufacturing the semiconductor memory device, according to the present invention. FIG. 6 depicts the first step of the method, and is a cross section of the device after the first step, taken along the line 6—6 of FIG. 5. FIG. 7 depicts the first step of the method, and is a cross section of the device after the first step, taken along the line 7—7 of FIG. 5. FIG. 8 depicts the second step of the method, and is a cross section of the device after the second step, taken along the line 8—8 of FIG. 5.

First, as can be seen in FIGS. 6 and 7, first element separation oxide films 23 are formed on the surface of a P-type silicon substrate 21 by the LOCOS method, using a mask (not shown) of an element separation pattern 22 arranged in a line/space manner as shown in FIG. 5.

More specifically, a silicon nitride film (not shown) is formed on the surface of the P-type silicon substrate, and the silicon nitride film is etched via the mask (not shown) having the element separation pattern 22. Then, that portion of the surface of the P-type silicon substrate 21 which is exposed by the etching is thermally oxidized, thus forming the line-shaped first element separation oxide films 23 parallel to a bit line (not shown), which is formed in a latter step. Then, the silicon nitride film is removed.

After that, as shown in FIG. 8, a sheath plate capacitor (HSPC) 31 is formed on the P-type silicon substrate 21.

That is, the first and second trenches 25a and 25b having a depth of about 3 µm are formed on the P-type silicon substrate 21 using a mask (not shown) having a trench pattern 24 shown in FIG. 5. The trenches 25a and 25b are situated at such positions that they come in contact with the first element separation oxide films 23 on both sides, and the trenches 25a and 25b run through a part of the first element separation oxide films 23.

Next, a SiO$_2$ film 26 is formed on only side walls of the trenches 25a and 25b. Then, a diffusion layer plate 27 is formed on bottom portions of the trenches 25a and 25b, and a plate electrode 28, formed by processing polysilicon into a sheath shape, is formed in each of the trenches 25a and 25b.

Next, a capacitor insulation film 29 is formed on an inner surface and a top surface of each plate electrode 28. Then, the trenches 25a and 25b are filled with polysilicon, thus forming a storage node electrode 30 in each of the trenches 25a and 25b. Thus, a sheath plate capacitor 31 consisting of the plate electrode 28, the capacitor insulation film 29 and the storage node electrode 30 is formed.

After that, an oxide film 32 is selectively formed on each storage node electrode 30. Then, a gate insulation film 33 is formed on the surface of the P-type silicon substrate 21. In the meantime, a second element separation oxide film 40 is formed between the trenches 25a and 25b. The second element separation oxide film 40 can be formed without removing the oxide film which was formed before the formation of the trenches. In either case, the second element separation oxide film 40 can be formed thinner than the first element separation oxide films 23.

Next, a polysilicon film 34a is deposited on the second element separation oxide film 40, the gate insulation film 33 and the oxide film 32, and a resist 35a is applied on the polysilicon film 34a.

After that, the resist 35a is patterned with a mask (not shown) of a word line pattern 36 shown in FIG. 5, thus forming a resist pattern 35 on the polysilicon film 34a. The polysilicon film 34a is etched with the resist pattern 35 serving as a mask, thus forming a gate electrode 34, a word line 38 and a pass word line 39, all made of the polysilicon film. The pass word line 39 is situated on the oxide film 32, and the word line 38 is situated on the gate insulation film 33.

Next, ion implantation is carried out using the gate electrode 34, and a diffusion layer 37 for the source-drain region is formed on the P-type silicon substrate 21. Thus, a memory cell consisting of one transistor having the gate electrode 34 and the diffusion layer 37 of the source-drain region, and one capacitor, which is the sheath plate capacitor 31 in the trenches 24a and 25b, is formed on the P-type silicon substrate 21. In the meantime, a diffusion layer 37a is formed between trenches 25a and 25b of two memory cells adjacent to each other in a direction parallel to a bit line (not shown) formed in a later step.

Note that although the diffusion layer 37a should be a P-type and have a higher concentration than the impurity concentration of the channel directly below the word line 38, the diffusion layer may not be formed. Further, in the case where the diffusion layer 37a is formed at the same time as the diffusion layer 37 of the source-drain region, the diffusion layer 37a should be N-type. In this case, it only suffices if the N-type diffusion layer 37a electrically floats. More specifically, the leak pass formed between diffusion layers 37 in the direction along the line 8—8 shown in FIG. 5, has a structure in which the first parasitic MOS, the diffusion layer 37a and the second parasitic MOS are connected in series. The first parasitic MOS has a structure in which the pass word line 39 corresponds to a gate, and the oxide film 26 of the inner wall of the first trench 25a corresponds to a gate insulation film. The second parasitic MOS has a structure in which the pass word line 39 corresponds to a gate, and the oxide film 26 of the inner wall of the second trench 25b corresponds to a gate insulation film. Therefore, with the operation voltage of the dynamic RAM, it only suffices if the leak current flowing the path of the above series is sufficiently small. In view of this, the thickness of the second element separation oxide film 40 can be set arbitrarily regardless of the concentration of the diffusion layer 37a directly underneath the oxide film 40.

After that, the resist pattern 35 is removed. Then, a bit line and a wiring (layer), neither shown, are formed, completing a dynamic RAM.

Figure 9:
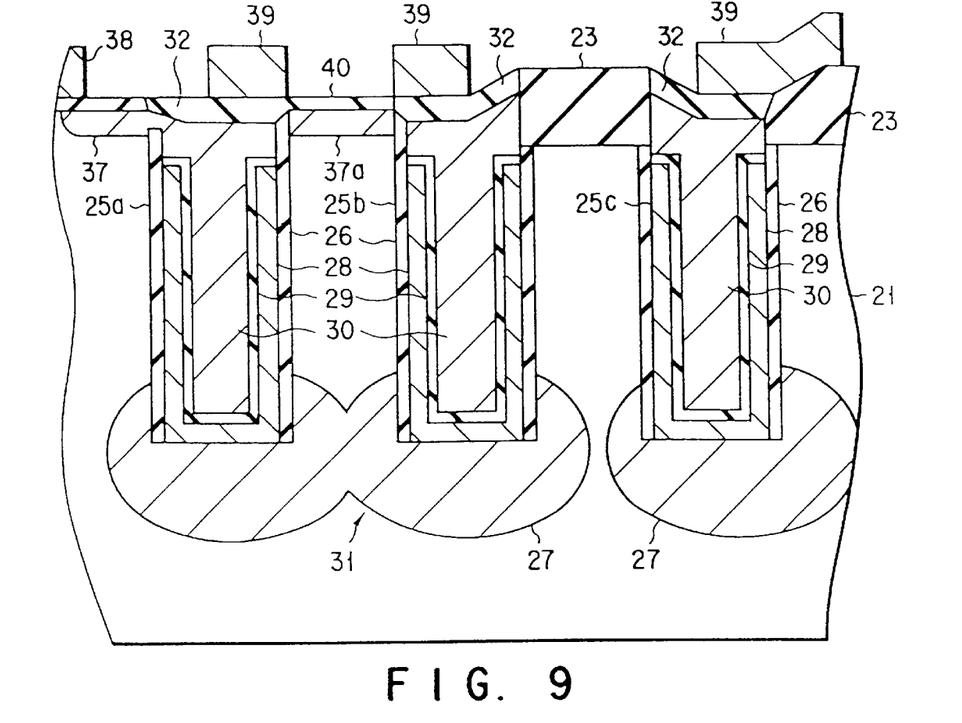
FIG. 9 is a cross section of the semiconductor memory device according to the present invention, taken along the line 9—9 of FIG. 5.

FIG. 9 is a cross section taken along line 9—9 of FIG. 5. In the P-type silicon substrate 21, first to third trenches 25a to 25c are formed. The second element separation oxide film 40 is formed on the surface of the P-type silicon substrate 21 and between the first and second trenches 25a and 25b. The first element separation oxide films 23, which are thicker than the second element separation oxide film 40, is formed on the surface of the P-type silicon substrate 21 and between the second and third trenches 25b and 25c.

In each of the trenches 25a to 25c, the sheath plate capacitor 31 consisting of the plate electrode 28, the capacitor insulation film 29 and the storage node electrode 30, is formed.

According to the above-described embodiment, the first element separation oxide films 23 are formed on the surface of the P-type silicon substrate 21 such that the line structure of the film 23 is in parallel with the bit line. When the pattern of the first element separation oxide films 23 is formed to have a structure of an arrangement of line-shaped portions, the transfer error which may vary from one element separation pattern to another, can be made constant. In other words, the problem of the conventional technique, i.e. the transfer error of the mask may vary from one pattern to another, can be solved. With this solution, the semiconductor memory device can be downsized, and the controllability in the manufacturing procedure can be enhanced. Consequently, the product yield can be increased. Further, the manufacture of the phase shift mask of the element separation pattern 22 can be facilitated, thus making it possible to achieve a further downsizing of the product.

Meanwhile, the first to third trenches 25a to 25c are formed in the P-type silicon substrate 21 located between lines of the first element separation oxide films 23, and the second element separation oxide film 40, which is thinner than the first element separation oxide films 23, is formed between the first and second trenches 25a and 25b. In other words, the second element separation oxide film 40, which is thinner than the first element separation oxide films 23, is formed between the lines of the first element separation oxide films 23. With this structure, the continuous surface over the second element separation film 40, the oxide film 32 and the gate insulation film 33 can be flattened as shown in FIG. 8. Consequently, unlike the conventional technique, no difference in level is created in that portion of the polysilicon film 34a formed on the second element separation film 40, the oxide film 32 and the gate insulation film 33, which is situated on the boundary between the oxide film 32 and the gate insulation film 33. Thus, the transfer error with regard to the pass word line 39 does not vary, and therefore the pass word line 39 is not formed narrower than designed. Hence, the performance of the device can be improved as compared to the conventional product.

In the above-described embodiment, the present invention is applied to a semiconductor memory device having a trench capacitor; however, the invention can be applied to a dynamic RAM having a stack capacitor.

Figure 10:
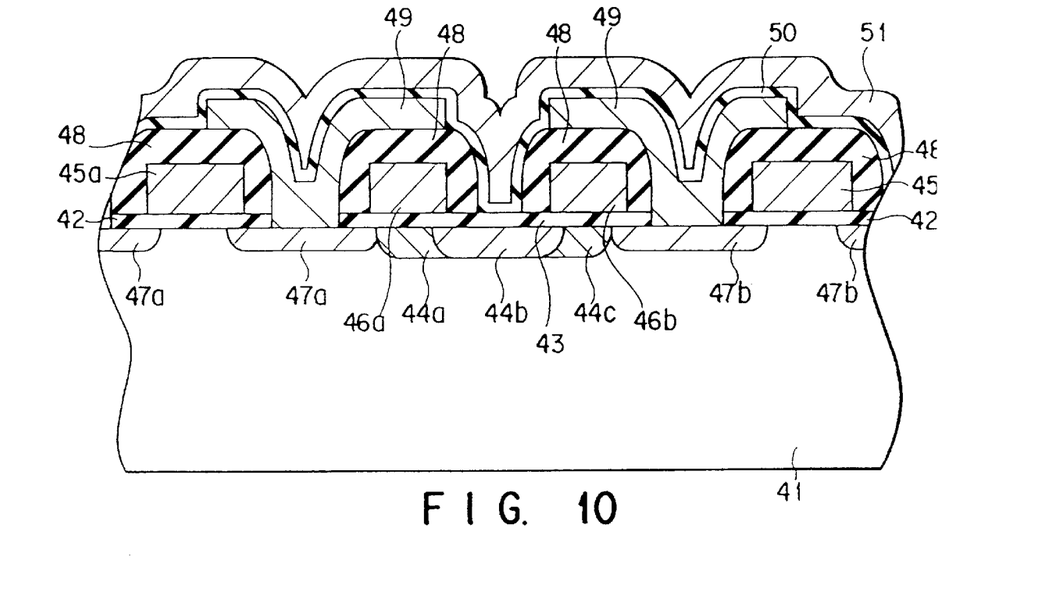
FIG. 10 is a cross section showing a semiconductor memory device according to an applied embodiment of the present invention.

That is, as can be seen in FIG. 10, element separation oxide films (not shown) arranged in a line/space manner are formed on the surface of a P-type silicon substrate 41. Next, a gate oxide film 42 and a second element separation oxide film 43 are formed on the surface of a P-type silicon substrate 41. The second element separation oxide film 43 is thinner than the first element separation oxide film. After that, high-concentration P-type regions 44a and 44c are formed on the surface of the P-type silicon substrate 41. Next, first and second gate electrodes 45a and 45b are formed on the gate oxide film 42, and first and second pass word lines 46a and 46b are formed on the second element separation oxide film 43. Then, the ion-implantation of impurities is carried out using the gate electrode 45a and 45b and the pass word lines 46a and 46b as a mask, thus forming diffusion layers 47a and 47b of the first and second source-drain regions in the surface portion of the P-type silicon substrate 41. Next, a high-concentration P-type region 44b is formed on the surface of the P-type silicon substrate 41.

After that, an interlayer insulation film 48 is formed on the gate electrodes 45a and 45b, the pass word lines 46a and 46b, the gate oxide film 42 and the second element separation oxide film 43. Next, a storage node electrode 49 is formed on the interlayer insulation film 48 and the diffusion layers 47a, 47b of the source-drain regions, and a capacitor insulation film 50 is formed on the storage node electrode 49. A plate electrode 51 is formed on the capacitor insulation film 50. After that, a bit line and a wiring layer (not shown) are formed on the plate electrode 51.

With the above-described dynamic RAM having the stack capacitor, a similar effect to that of the first embodiment can be achieved.

The leak pass running from the diffusion layer 47a of the first source-drain region to the diffusion layer 47b of the second source-drain region in the direction along the cross section shown in FIG. 10 has a structure in which the first parasitic MOS, the high-concentration P-type regions 44b, and the second parasitic MOS are connected in series. The first parasitic MOS has a structure in which the first pass word line 46a corresponds to a gate, and the second element separation oxide film 43 corresponds to a gate insulation film. The second parasitic MOS has a structure in which the second pass word line 46b corresponds to a gate, and the second element separation oxide film 43 corresponds to a gate insulation film. Therefore, in the case where the thickness of the second element separation oxide film 43 is the same as that of the gate oxide film 42, the impurity concentration of the P-type regions 44a and 44c should be higher than that of the channel formed underneath the gate electrodes 45a and 45b. Further, it is preferable that the region 44b should be P-type and have a high impurity concentration; however if the leak current flowing through the first and second parasitic MOSes can be suppressed to a sufficiently low level, the region 44b may not be a high-impurity concentration P-type region.

Additional advantages and modifications will readily occur to those skilled in the art. Therefore, the invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. A method of manufacturing a semiconductor memory device, comprising the steps of:

forming a first element separation oxide film having a structure consisting of a plurality of parallel lines spaced apart from each other, on a surface of a semiconductor substrate; and forming trenches on a first portion of said semiconductor substrate situated between a pair of lines of said first element separation oxide film, both side regions of said trenches used for a capacitor of said semiconductor memory device formed therein and being in contact with said first element separation oxide film.

2. A method of manufacturing a semiconductor memory device, comprising the steps of:

forming a first element separation oxide film having a structure of a plurality of lines parallel to each other, on a surface of a semiconductor substrate;

forming first and second trenches on a portion of said semiconductor substrate situated between a pair of lines of said first element separation oxide film;

forming a plate electrode in said semiconductor substrate, said plate electrode being in contact with said first and second trenches;

forming a capacitor insulation film in said first and second trenches and on said plate electrode;

forming an insulating film on sidewalls of said first and second trenches, said insulating film being connected to said first element separation oxide film;

forming a storage node electrode in said first and second trenches and on said capacitor insulation film;

forming an oxide film on said storage node electrode;

forming a gate insulation film on a surface of said semiconductor substrate located between said pair of lines of said first element separation oxide film;

forming a second element separation oxide film on a portion of said semiconductor substrate located between said first and second trenches, said second element separation oxide film having a thickness less than a thickness of said first element separation oxide film;

forming a gate electrode on said gate insulation film; and forming source/drain regions in said semiconductor substrate, one of said source/drain regions being connected to said storage node electrode.

3. A method of manufacturing a semiconductor memory device according to claim 2, further comprising the step of forming a capacitor in the first and second trenches.

4. A method of manufacturing a semiconductor memory device according to claim 2, further comprising the step of forming a word line on said first and second trenches normal to said element separation oxide film.

5. A method of manufacturing a semiconductor memory device according to claim 1, further comprising the step of forming an insulating film on sidewalls of said trenches, said insulating film being connected to said first element separation oxide film.

6. A method of manufacturing a semiconductor memory device according to claim 2, wherein said second element separation oxide film and said gate insulation film are formed simultaneously.

7. A method of manufacturing a semiconductor memory device according to claim 6, wherein said gate insulation film, said oxide film and said second element separation oxide film form a continuous surface.

8. A method of manufacturing a semiconductor memory device according to claim 2, further comprising the step of forming pass word lines on said oxide film of said storage node electrode in said first and second trenches.

9. A method of manufacturing a semiconductor memory device according to claim 2, further comprising the step of forming an impurity diffusion region between said first and second trenches.

10. A method of manufacturing a semiconductor memory device according to claim 9, wherein an impurity concentration of said impurity diffusion region is greater than an impurity concentration of said semiconductor substrate.

11. A method of manufacturing a semiconductor memory device according to claim 2, wherein said trenches are in contact with a part of said first element separation oxide film.

12. A method of manufacturing a semiconductor memory device according to claim 1, wherein said both side regions of said trenches are formed by etching said element separation oxide film.

13. A method of manufacturing a semiconductor memory device according to claim 1, further comprising the step of forming a second element separation oxide film on a second portion of said semiconductor substrate which is located between first and second trenches, said second element separation oxide film being thinner than said first separation oxide film.

14. A method of manufacturing a semiconductor memory device comprising the steps of:

forming a first element separation oxide film having a structure of a plurality of lines parallel to each other, on a surface of a semiconductor substrate;

forming first and second trenches on a portion of said semiconductor substrate situated between a pair of lines of said first element separation oxide film;

forming a capacitor in said first and second trenches, said capacitor including a plate electrode, a capacitor insulating film and a storage node electrode; and forming a gate insulating film and a second element separation oxide film on a surface of said semiconductor substrate, said gate insulating film being located between said pair of lines of said first element separation oxide film, and said second element separation oxide film being located between said first and second trenches, wherein said second element separation oxide film has a thickness less than a thickness of said first element separation oxide film.

15. A method of manufacturing a semiconductor memory device according to claim 14, further comprising the steps of:

forming a gate electrode on said gate insulating film; and forming source/drain regions in said semiconductor substrate, one of said source/drain regions being connected to said storage node electrode.

* * * * *